United States Patent
Mays, II

(10) Patent No.: US 6,392,372 B1
(45) Date of Patent: May 21, 2002

(54) BRUSHLESS DC FAN MODULE INCORPORATING INTEGRAL FAN CONTROL CIRCUIT WITH A COMMUNICATION PORT FOR RECEIVING DIGITAL COMMANDS TO CONTROL FAN

(75) Inventor: Ford Chapman Mays, II, Austin, TX (US)

(73) Assignee: LJM Products, Inc., Austin, TX (US)

( * ) Notice: Subject to any disclaimer, the term of this patent is extended or adjusted under 35 U.S.C. 154(b) by 0 days.

(21) Appl. No.: 09/540,291

(22) Filed: Mar. 31, 2000

(51) Int. Cl.$^7$ .................................................. H02P 6/02
(52) U.S. Cl. ......................... 318/254; 318/599; 318/138
(58) Field of Search .................................. 318/599, 439, 318/138, 254

(56) References Cited

U.S. PATENT DOCUMENTS

| | | | |
|---|---|---|---|
| 4,500,821 A | | 2/1985 | Bitting et al. ............... 318/254 |
| 4,656,553 A | * | 4/1987 | Brown ......................... 318/31 |
| 4,983,895 A | * | 1/1991 | Koharagi et al. ........... 318/254 |
| 5,099,181 A | * | 3/1992 | Cannon ....................... 318/254 |
| 5,146,145 A | * | 9/1992 | Wood et al. ................ 318/254 |
| 5,345,156 A | * | 9/1994 | Moreira ....................... 318/254 |
| RE35,124 E | | 12/1995 | Erdman et al. ............. 318/599 |
| 5,473,229 A | * | 12/1995 | Archer et al. ............... 318/254 |
| 5,492,273 A | | 2/1996 | Shab ........................ 236/44 A |
| 5,513,361 A | | 4/1996 | Young ......................... 395/750 |
| 5,600,634 A | | 2/1997 | Satoh et al. ................ 370/294 |
| 5,687,079 A | | 11/1997 | Bauer et al. ................ 364/175 |
| 5,727,928 A | | 3/1998 | Brown .................... 417/44.11 |
| 5,744,921 A | | 4/1998 | Makaran ..................... 318/254 |
| 5,848,282 A | | 12/1998 | Kang .................... 395/750.05 |
| 6,147,465 A | * | 11/2000 | Hollenbeck ................. 318/254 |

FOREIGN PATENT DOCUMENTS

| | | |
|---|---|---|
| DE | 198 36 882 A1 | 2/2000 |
| EP | 0 899 862 A2 | 3/1999 |

OTHER PUBLICATIONS

"Cooling Module and Related Control Circuits Useful Therefor Incorporating a Communication Port for Receiving Digital Command Signals to Control Module", U.S. App. No. 09/664,619, filed Sep. 19, 2000, Ford Chapman Mays, II, inventor 72 pages.
"Fan Controller and Remote Temperature Sensor with SMBus Serial Interface", Maxim Integrated Products Press Release, Nov. 3, 1999 [online][printed Aug. 21, 2001] Retrieved from the Internet <URL: http://dbser.maxim-ic-.com/view_press_release.cmf?release_id=76>, 1 page.
"Fan Controller and Remote Temperature Sensor with SMBus Serial Interface", Maxim Integrated Products MAX1669 datasheet, 19–1574; Rev. 0; Jan. 2000, 20 pages.
"Fan Motor 2–Phase Half–Wave Driver", Sanyo Electric Co., Ltd. Semiconductor Company Monolithic Digital IC LB1967M datasheet, Tokyo, Japan, Oct. 1999, 4 pages.

(List continued on next page.)

*Primary Examiner*—Robert E. Nappi
*Assistant Examiner*—Rita Leykin
(74) *Attorney, Agent, or Firm*—Zagorin, O'Brien & Graham, LLP

(57) ABSTRACT

A fan module includes integral fan control circuitry which independently implements a self-contained start and run motor control loop and also includes a communications port to accept commands from a host processor and to provide status and other data in response to queries from the host processor. In one embodiment, the fan module interfaces with a two-wire serial bus, such as an I$^2$C bus or SMbus, and accepts commands and provides status and data in a serial digital format. A variety of commands such as on/off, and various speed control settings may be received from the host system. The actual speed of the fan may be reported back when queried by the host system. In some embodiments the temperature of the fan or of the air flow through the fan may be reported back when queried. The entire fan control circuit may be incorporated within the fan housing and a simple serial two-wire interface may be provided in addition to the two power terminals for the fan, resulting in a compact four-wire interface for the fan module.

41 Claims, 11 Drawing Sheets

OTHER PUBLICATIONS

"W83L784R Winbond H/W Monitoring IC", Winbond Electronics Corp. datasheet, Rev. 0.54, Sep. 1999, 56 pages.

ADI—ADM1022, Analog Devices, Inc., [online] [retrieved on Nov. 17, 1999] 1 page. Retrieved from the Internet: <URL: http://www.analog.com/products/descriptions/ADM1022.html>.

Alfano, Don and Judkins, Jim. "Intelligent Thermal Management Using Brushless DC Fans," TelCom Semiconductor, Inc., Mountain View, CA, Sep. 16, 1997, pp. 1–8.

AMI MegaPro Specifications, GAIN Systems 1997. [online] [retrieved on Nov. 16, 1999] 2 pages. Retrieved from the Internet: <URL: http://www.gainsystems.com/megapro.htm>.

Analog Devices Introduces DMI 2.0–Compliant Motherboard Life Support Monitor—ADM9240 recommended by Intel™ for Pentium II motherboards, Analog Devices, Inc., Press Release Feb. 9, 1998 [online] [retrieved Nov. 16, 1999] 2 pages. Retrieved from the Internet: <URL: http://www.edtn.com/scribe/reference/webscan/mn0019f2.htm>.

Azzam, Nizar, "Definitions and Differences Between $I^2C$, ACCESS.bus and SMBus," Standard Microsystems Corporation Technical/Application Notes, Hauppauge, NY, 1999 [online] [retrieved Nov. 16, 1999] 5 pages. Retrieved from the Internet: <URL: http://www.smsc.com/main/appnotes/an617.html>.

Bindra, Ashok. "TelCom chips tackle fan, motor speed," EETimes.com, [online] [retrieved on Nov. 17, 1999] 2 pages. Retrieved from the Internet: <URL: http://eetimes.com/news/97/967 news/telecom.html>.

Chassis Management Module (CMM), Tracewell Systems, [online] [retrieved Nov. 17, 1999] 1 page. Retrieved from the Internet: <URL: http://www.tracewellsystems.com/chassis%20mgmt/chassismgmt_main.htm>.

Chassis Management Solutions, Tracewell Systems, [online] [retrieved Nov. 11, 1999] 1 page. Retrieved from the Internet: <URL: http://www.tracewellsystems.com/chassis%20monitoring/monitor_main.htm>.

Hardware Monitoring & Control, Texas Instruments In. Product Preview, 1999 [online] [retrieved Nov. 17, 1999] 3 pages. Retrieved from the Internet: <AURL: http://www.ti.com/sc/docx/msp/hmc/prodprv.htm>.

Lancanette, Kerry, "Using IC Temperature Sensors to Protect Electronic Systems," Sensors Magazine, Jan. 1997 [online] [retrieved on Nov. 17, 1999], 7 pages. Retrieved from the Internet: <URL: http://www.sensorsmag.com/articles/0197/electric/main.shtml>.

LM75—Digital Temperatore Sensor and Thermal WATCHDOG™ with Two–Wire Interface, National Semiconductor Corp. datasheet, Jun. 1999 pp. 1–16.

LM78 Microprocessor System Hardware Monitor, National Semiconductor Corporation data sheet, Jun. 1999, pp. 1–6, 12–14.

Max1619—Remote Local Temperature Sensor with Dual Alarm Outputs and SMBus Serial Interface, Maxim Quick View Data Sheet, Sep. 8, 1999. [online] [retrieved on Nov. 17, 1999] 2 pages. Retrieved from the Internet; <URL: http://dbserv.maxim–ic.com/quick_view2.cfm?pd_num+2021>.

MegaPro Dual 180 & 200 MHz, Pentium® Pro ISA/PCI, American Megatrends, Inc. 1996 [online] [retrieved on Nov. 16, 19999] 3 pages. Retrieved on the Internet: <URL: http://www.devita.com/megapropict.html>.

National Semiconductor's New Diagnostic IC Monitors Key Analog and Digital Functions for Microprocessor–Based Systems, National Semiconductor News Release, Aug. 20, 1996. [online] [retrieved on Nov. 16, 1999] 3 pages. Retrieved from the Internet: <URL: http://www.national-.com/news/1996/9608/lm78.html>.

Philips Semiconductors develops $I^2C$–bus peripheral chip for software configuration of Pentium® II—processor type motherboards, Philips Semiconductors Product News, Mar. 23, 1998. [online] [retrieved on Nov. 16, 1999] 2 pages. Retrieved from the Internet: <URL: http://www.semiconductors.com/news/content/file_305.html>.

RPC Electronics DC Fan Controllers, RPC Electronics. [online] [retrieved on Nov. 17, 1999] 1 page. Retrieved from the Internet: <URL: http://www.radiopartsco.com/fan_controllers.htm>.

SK7–EISCA—Enhanced Intelligent System Cooler Architecture, PentAlpha product sheet [online] [retrieved Nov. 16, 1999] 3 pages. Retrieved from the Internet: <URL: http://www.pentalpha.com/Product/sk7EISCA.htm>.

SmartFan® Controllers—AC–VX, Control Resources, Inc., Littleton, MA, 1997, [online] [retrieved on Nov. 17, 1999] 2 pages. Retrieved from the Internet: <URL: http://www-.controlres.com/ac–vx.htm>.

SMBus and $I^2C$ Bus Design, Rev. 1.0, Intel Corporation Specification, Apr. 18, 1997, pp. 1–15.

System Management Bus Specification, Smart Battery System Specifications Revision 1.1, SBS Implementers Forum, Dec. 11, 1998, pp. i–vi, 7–39.

TC643—Integrated Fan/Motor Driver, TelCom Semiconductor, Inc. datasheet, Sep. 29, 1997, 1 page.

TC646—Fan Speed Controller with Auto–Shutdown, TelCom Semiconductor, Inc. datasheet, Apr. 7, 1998, 1 page.

TC647—PWM Fan Speed Controller with Fault Detection, TelCom Semiconductor, Inc. datasheet Aug. 31, 1999, 1 page.

TC648—Fan Speed Controller with Auto–Shutdown, TelCom Semiconductor, Inc. datasheet, Mar. 19, 1998, 1 page.

Temperature Controlled PC Fan with RS232 Output, Peter Lynch, Aug. 1998 [online] [retrieved on Nov. 17, 1999] 2 pages. Retrieved from the Internet: <URL: http://www.beowulf.demon.co.uk/fan/html>.

World'First Dual Input Fan Control IC Targets NLX Power Supplies, Micrel Semiconductor, San Jose, CA. Dec. 31, 1998. [online] [retrieved on Nov. 16,1999] 3 pages. Retrieved from the Internet; <URL: http://www.micrel.com/press/PR/pr–43.html>.

* cited by examiner

BRUSHLESS DC FAN MODULE INCORPORATING INTEGRAL FAN CONTROL CIRCUIT WITH A COMMUNICATION PORT FOR RECEIVING DIGITAL COMMANDS TO CONTROL FAN

BACKGROUND OF THE INVENTION

1. Field of the Invention

The present invention relates to the control of brushless DC motors, and particularly relates to the control of brushless DC motors within fan modules of a type suitable for use in personal computers and similar electronic equipment.

2. Description of the Related Art

Brushless DC fans have found wide use in cooling electronic equipment such as personal computers. Such fans incorporate a brushless DC motor (BLDC motor) which includes a stationary armature. At least two winding stages are configured around an armature core to provide a predetermined number of poles, and permanent magnets are mounted on the rotor of the fan. Frequently such fans incorporate two winding stages which are arranged to generate four magnetic poles in the armature, although greater numbers are possible. A traditional two-terminal BLDC fan motor usually incorporates circuitry to electronically commutate the winding stages to operate the motor at its fall speed for the particular power supply voltage applied. Such circuitry frequently incorporates a rotor sensor to determine when the rotor has rotated sufficiently for the next winding stage to be energized. BLDC motors are also frequently known as electronically commutated motors.

BLDC fans have significant advantages over other kinds of fans. There is no rotating commutator or brush assembly as with traditional DC motors. Consequently, much fewer dust particles are generated which, if shed, may contaminate the equipment. There are fewer parts to wear out, and there is much less ignition noise than with a brush assembly. Furthermore, the magnetic coils of a BLDC motor are mounted on a rigid frame which improves the thermal dissipation of the motor and provides for greater structural integrity of the motor. BLDC fan motors are also much more electrically quiet than other kinds of motors previously used.

Despite all of these advantages, BLDC motors typically still wear out faster than the electronic systems they are included to protect. Mainly, such wear-out is caused by a failure of the bearings supporting the rotor assembly. Also, any fan generates acoustic noise which may be ergonomically displeasing to an operator of equipment incorporating such a fan. Likewise, as with all fans, the fan may become blocked by foreign matter, or filters included in the air flow path generated by the fan may become increasingly clogged with particulate matter which results in a higher strain on the motor driving the fan, and ultimately, an inability of the fan to provide the air flow for which the system was designed.

To reduce the detrimental aspects of using BLDC fans, fan-speed management has proven useful to drive such fans only when needed and only at a speed sufficiently useful to cool the system within which the fan is incorporated. Such fan-speed management results in less acoustic noise, either because the fan is totally off at certain times or is throttled to a much lower speed for a typical operation than its maximum speed which is only driven in a worst-case cooling demand. By throttling back the power of a BLDC fan, significant power dissipation is also saved, which is particularly important in battery-powered systems.

There are a variety of ways that BLDC motors, and particularly BLDC fans, have been controlled in attempt to provide fan-speed management. In its simplest implementation, such fans may be turned fully on or fully off. In a system incorporating such an on/off technique, the fan is turned on typically when a measured temperature somewhere in the system exceeds a first threshold limit, and the fan is turned off when that same temperature is below a second threshold limit (usually lower than the first threshold limit to provide hysteresis). This technique is effective when the fan is unnecessary for most operating conditions and may, therefore, be left off except in the most unusual circumstances. Nonetheless, such control has its drawbacks. For example, when the fan is on, it usually runs at full speed, in which case the acoustic noise is at its worst. Furthermore, if the temperature of the system hovers near the threshold temperatures, a displeasing frequent cycling of the fan may occur as the temperature is driven below the second threshold and allowed to rise above the first threshold with frequent cycling of the power to the fan.

In many systems, a temperature proportional cooling method has been devised to variably increase the speed of a cooling fan as a function of the heat generation or the temperature of the system to be protected. One method of controlling the speed of a brushless DC motor is to regulate the voltage powering the motor to a lower voltage than the nominal operating voltage that the motor is normally specified to require. Referring now to FIG. 1, a standard brushless BLDC motor 40 is shown having one power terminal tied to ground, and the other power terminal connected to a triple darlington transistor circuit (i.e., transistors 41, 42 and 43) to a 12-volt positive power supply voltage. A variable control voltage, indicated in the figure as a variable voltage 44, is applied to the control terminal of transistor 41 and the current is amplified by transistor 42, and yet again, by transistor 43, to provide on the power terminal 45 of the BLDC motor 40 a substantially fixed voltage which is a function of the control voltage 44. Raising the control voltage 44 similarly raises the voltage applied to terminal 45, which is usually about 1.5 volts below the control voltage 44. The current drawn through BLDC motor 40 is generally proportional to the voltage applied across the motor. For example, if the current drawn by BLDC motor 40 at 12 volts is 300 milliamps, the current drawn through the BLDC motor 40 will usually be approximately 150 milliamps if terminal 45 is instead controlled to a 6-volt level. The linear voltage regulator circuit shown in FIG. 1 has several advantages, not the least of which it is extremely easy to design. It provides for a fan speed decrease which is almost linear with decreasing voltage. However, the power dissipation in the voltage regulator itself is substantial. At low fan speeds, the power dissipation of the regulator circuit may actually exceed the power consumed by the fan. This suggests large transistors may be necessary, and external heat sinks may need to be provided to dissipate the heat generated by such a large amount of current flowing through a circuit with a large voltage drop across the same circuit. Generating all of this additional heat seems counter-productive to the purpose of having the fan incorporated within the system in the first place. Consequently, such a linear voltage regulator fan-speed control has found decreasing use in recent years. Nonetheless, such a circuit does extend fan life if the system is designed to rarely require the fan to operate at full speed. Likewise, controlling the fan in this fashion may reduce acoustic noise typically generated by the system.

Another method of controlling the speed of a brushless DC motor involves chopping the power to intermittently apply full power to the motor at certain times, and applying no power to the motor at other times. This is usually accomplished with a relatively low-frequency (30–250 Hz) pulse-width-modulated (PWM) signal. One terminal of the BLDC motor may be connected to one power supply, and the other terminal may be connected to ground through a power switching device which is driven appropriately by the PWM signal.

Referring now to FIG. 2A, the brushless DC motor 40 discussed previously is here shown with one terminal connected to a +12 volt source of voltage and a second terminal 54 coupled through an MOS transistor 50 to ground. The gate of transistor 50 is generated by a pulse-width-modulated signal generator 51, which is responding to a control signal for controlling the speed of the BLDC motor 40. By using the pulse-width-modulated signal coupled to the gate of driver transistor 50, and assuming that transistor 50 is sized appropriately large, the average power consumed by transistor 50 is much lower than in the linear voltage regulator circuit described in FIG. 1. This occurs because driver transistor 50 is either fully turned on or fully turned off. When it is turned on by the pulse-width-modulated signal coupled to its gate terminal, the drain to source voltage is quite low (e.g., 0.5 volts) because the fan motor terminal 54 is pulled nearly to ground. While there may be significant amount of current flowing through driver transistor 50, there is not a large voltage drop across driver transistor 50, and so the instantaneous power during this portion of a cycle is very low. When driver transistor 50 is off, of course, no current flows, and there is no power dissipated instantaneously by driver transistor 50. Such a pulse-width-modulated speed control of a brushless DC motor, such as for a fan, has found wide use because of the much lower power dissipation compared to linear voltage regulator schemes, and due to the fact that a pulse-width-modulated signal at a 30 to 250 Hz rate is easily generated in either hardware or software and at very low cost.

Referring now to FIG. 2B, a similar circuit is shown incorporating a bipolar driver transistor 52, having a current limiting base resistor 53 connecting the output of the pulse-width-modulated signal generator 51 to the base terminal of transistor 52 to set the drive current into the base terminal and, consequently, provide for sufficient collector to emitter current through driver transistor 52 to fully support the current flow necessary through brushless DC motor 40.

A great many commercially available integrated circuits have been developed to generate useful pulse-width-modulated signals for controlling, in configurations similar to those shown in FIG. 2A and FIG. 2B, the speed of a brushless DC motor. Some of these circuits include temperature sensors which may be configured in a closed loop fashion to automatically control the speed of such a connected fan as a function of the locally measured temperature. Others of these integrated circuits include provisions for communicating with the whole system. Some generate the PWM signal to drive (either directly or through a buffering circuit) one of the power terminals of a standard two-terminal BLDC fan. Others generate a simple on/off control which may be used to control current through a BLDC fan.

Some types of brushless DC fans include a brushless DC motor which provides a tachometer output terminal. A pulse signal is generated on the tachometer terminal by the fan as a function of the internal self-commutation of the winding stages occurring internal to the fan. By sensing the various pulses generated on the tachometer output, the rotational speed of the fan may be determined, and an RPM (revolutions per minute) indication may be computed, or a fault condition, such as a stuck or locked rotor, may also be detected. Other commercial devices have been developed which provide a similar tachometer output or tachometer capability when using standard two-terminal brushless DC motors without a built-in tachometer output. Most such circuits generate the tachometer indication by including a low-valued resistor in the current path powering the fan motor. A voltage pulse across the resistor is generated when the commutation internal to the fan occurs because of the brief interruption of current flow through the winding stages within the fan motor.

Many commercial devices, particularly those incorporating temperature sensing capability, include provisions for sensing the speed of a fan, but lack any ability to control the speed of a fan. These are mostly used to sense alarm conditions, such as a clogged filter or an actually stuck rotor. One device, available from National Semiconductor Corporation, is known as the LM75. This device includes a serial interface compatible with the I²C™ interface standard (initially developed by, and a trademark of Philips Corporation) for communicating with a host system, and includes a temperature sensor and an on/off output for a fan control. The I²C interface, which is also similar to, largely compatible with, and known by many as the SMBus interface (popularized by Intel Corporation, Santa Clara, Calif., and widely supported by many other companies), is a popular two-wire serial interface, originally developed to provide power management control in battery-powered systems.

Other devices incorporate such an I²C interface and include a digital to analog converter (DAC) for generating on an output pin an analog voltage which can be used to control the speed of a brushless DC fan. For example, the THMC50, available from Texas Instruments, Inc., can be used to provide a controllable analog voltage on an output pin, which voltage may be used either in a linear voltage regulator, as described in relation to FIG. 1, or to modulate the pulse width of a PWM signal for controlling fan speed, as described in relation to FIG. 2.

One industry specification known as NLX calls for a zero to 10.5-volt analog signal which is used to set the fan speed. Controller integrated circuits are available to take this variable voltage signal and generate the pulse-width-modulated signal necessary to drive the power terminal of a fan motor. Such an analog control voltage may also be provided by a DAC output of a microcontroller or other device which may be incorporated within the system. And yet another standard, known as the EISCA standard, provides for the sensing of a variety of system voltages and system temperatures measured at several locations within the system, provides for a fan speed indication, and includes an I²C interface to communicate with the host processor. A great many industry-available devices provide for local and remote temperature sensing with an I²C bus interface. In another device available from Tracewell Systems, a Chassis Management Module product includes an I²C interface for communication with the host processor and a PWM channel output for each of two fans, for controlling each fan in a fashion as described in FIG. 2A and FIG. 2B. Yet another device, the LM78, available from National Semiconductor Corp., monitors temperature, voltage and fan speed, and includes an I²C interface.

In spite of these seemingly highly-specialized commercial solutions for various temperature voltage sensing and fan speed sensing and/or control, a variety of problems remain. Most notably, the internal commutation of the winding stages within the BLDC motor is asynchronous to the external power modulation (i.e., the "power chopping") of the fan power by the PWM signal driving the motor. The electrical noise is consequently worse. Also the tachometer output may only be generated when the motor is energized by the PWM signal. This makes RPM determinations more difficult, particularly when the fan speed is much slower than fall rate. Worse, the tachometer signal may have spurious noise spikes associated with the beginning and the end of the power switching due to the PWM signal applied to the power terminals of the fan motor. This may result in erroneous determination of the actual fan rotational speed and RPM. Moreover, all of these solutions require additional integrated circuits and other discrete components in addition to the fan itself to provide the cooling solution sought to be achieved.

Consequently, there is still a need for a better solution where thermal management, power control, sound level, and reliability are paramount.

SUMMARY OF THE INVENTION

An improved fan module includes integral fan control circuitry which independently implements a self-contained start and run motor control loop and also includes a communications port to accept digital commands from a host processor and to optionally provide status and other data in response to queries from the host processor. In one embodiment, the fan module interfaces with an internal system management bus, such as the SMbus or $I^2C$ bus, and accepts commands and provides status and data in a serial digital format. A variety of commands such as on/off, and speed control settings may be received from the host system. The actual speed of the fan may be reported back when queried by the host system. In some embodiments the temperature of the fan or of the air flow through the fan may be reported back when queried.

Such an improved fan module is highly useful for personal computers, workstations, servers, embedded systems, and other electronic systems incorporating fans for cooling. The entire fan control circuit may be incorporated within or attached to the fan housing and a simple serial two-wire interface may be provided in addition to the two power terminals for the fan, resulting in a compact four-wire interface for the fan module. In one embodiment of the invention, the power coupled to the BLDC motor is not regulated to lower voltages, nor is it chopped in a PWM fashion, but is maintained at the fixed power supply voltage provided to the fan module. The power supply voltage may be chosen from, for example, 7 volts to 30 volts. All speed control, as well as on/off control, is communicated to the fan via the serial interface, and the speed is controlled independently of the particular power supply voltage chosen.

A fan module in accordance with the present invention affords all of the benefits previously achieved by varying the speed of brushless DC fans, such as enhanced ergonomics and enhanced reliability due to operating the fan speed, at least for a significant percentage of the time, at less than its fill rated speed. In addition, however, system reliability is further enhanced by eliminating the requirement of additional integrated circuits and discrete components otherwise necessary to achieve the previously discussed forms of speed control. Moreover, by directly converting a digital speed command to appropriate signals driving the internal winding stages of the BLDC motor within the fan module, much less electrical noise is generated compared to that generated if chopping the power to a standard brushless DC fan motor. The digital command may include, for example, an eight-bit control word to indicate the desired speed, and consequently a much greater degree of control over the fan speed may be achieved than with other methods.

Provision for responding to a variety of different commands may be designed into such a fan module and other capabilities included within its design. For example, the fan module may be designed to initially provide a default speed when first powered up (e.g., fall-rated speed) to ensure adequate cooling without requiring any digital commands communicated to the fan module. After reaching a run state at the default speed, the fan module may then be commanded to a different speed as required by the system. Other queries which may be incorporated within such a fan module include responding to a manufacture and model number request, responding to actual angular velocity or RPM of the fan, providing the delta between the commanded speed and the actual speed, and others. This capability allows a host system to determine when the fan is unable to achieve the speed commanded, indicating a possible clogged filter or high bearing wear, and would further allow such a system to alert a maintenance provider to schedule periodic maintenance of the fan before an outright failure of the fan. The fan module may also be designed to respond to a command to operate in an automatic mode which increases fan speed appropriately as ambient airflow temperature or other self-determined temperature increases without requiring supervision by the host system.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
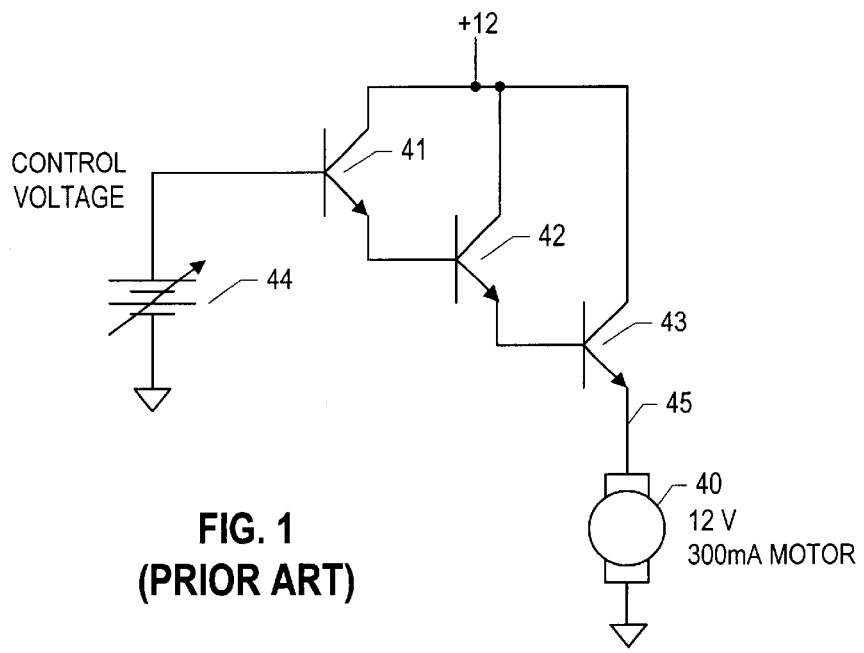
FIG. 1, labeled Prior Art, is a schematic drawing illustrating a linear voltage regulation method of controlling the speed of a brushless DC motor.
Figure 2A:
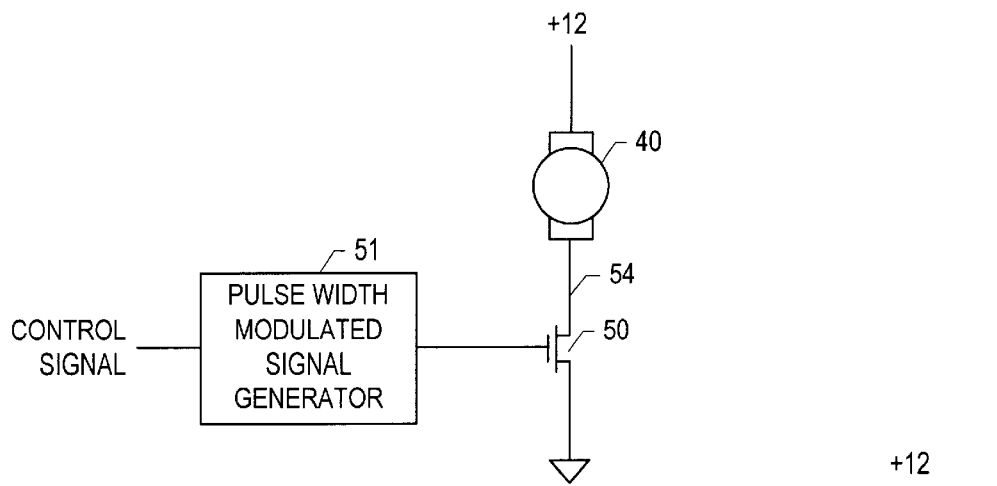
FIG. 2A, labeled Prior Art, is a schematic drawing illustrating a pulse-width-modulated technique for chopping the power applied to a brushless DC motor to achieve speed control of the motor.
Figure 2B:
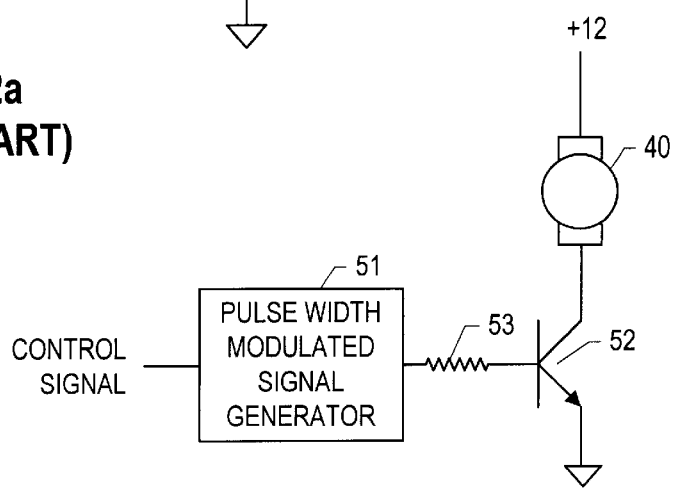
FIG. 2B, labeled Prior Art, is a schematic drawing illustrating another embodiment of a pulse-width-modulated technique similar to that shown in FIG. 2A.
Figure 3:
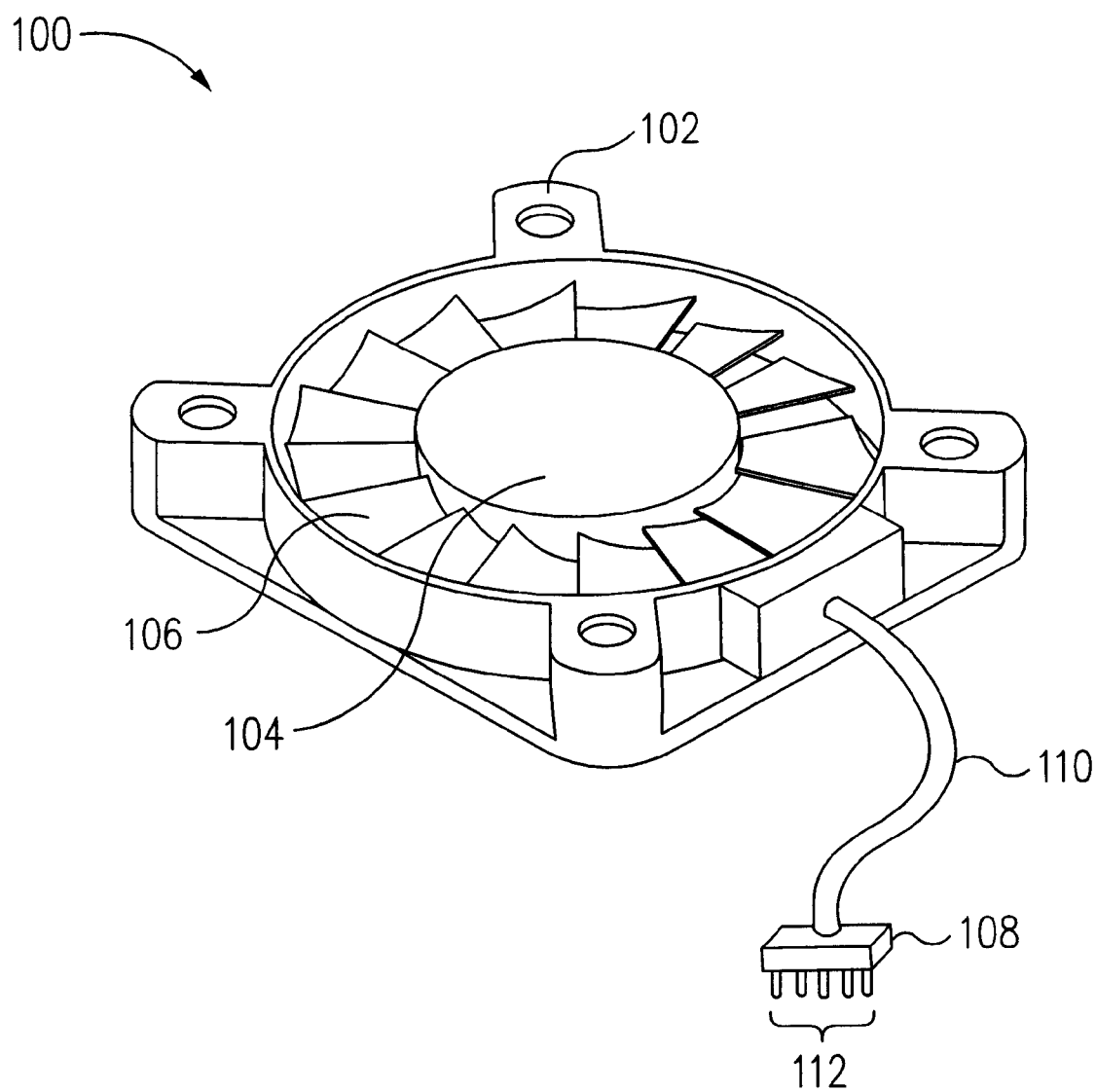
FIG. 3 is a three-dimensional drawing illustrating a fan module in accordance with the present invention.

Referring now to FIG. 3, a fan module 100 in accordance with the present invention is depicted. A fan housing 102 is shown and provides the traditional frame for the fan assembly. A rotor 104 is shown with a plurality of fan blades (one of which is labeled as 106) connected radially around the circumference of the rotor 104. Such a fan may include greater or lesser numbers of fan blades than depicted in FIG. 3. A stationary armature (not shown) is located in the center of fan housing 102, and in FIG. 3 is located below the rotor 104. The fan control circuitry, including a communications port for receiving digital commands, is integral to the fan module 100 and may be located within or attached to the fan housing 102, or may be wholly or partially located within the stationary armature in the center of the fan housing 102. A cable 110 is shown which provides a connection to terminal pins 112 (shown here with five terminal pins 112) which are connected to a connector 108. This connector 108 is plugged into a receiving socket to provide power to the fan module and to provide connections to the communication port as well. Other numbers of terminal pins 112 may also be advantageously implemented. All of the necessary control circuitry is preferably wholly contained within the fan module, and no external components are necessary to provide any direct control of the speed of the fan, nor for the actual control loop of the winding stages themselves. Alternatively, rather than a cable 110, a connector may be integrated within the fan housing 102 to receive a cabled connector.

Figure 4:
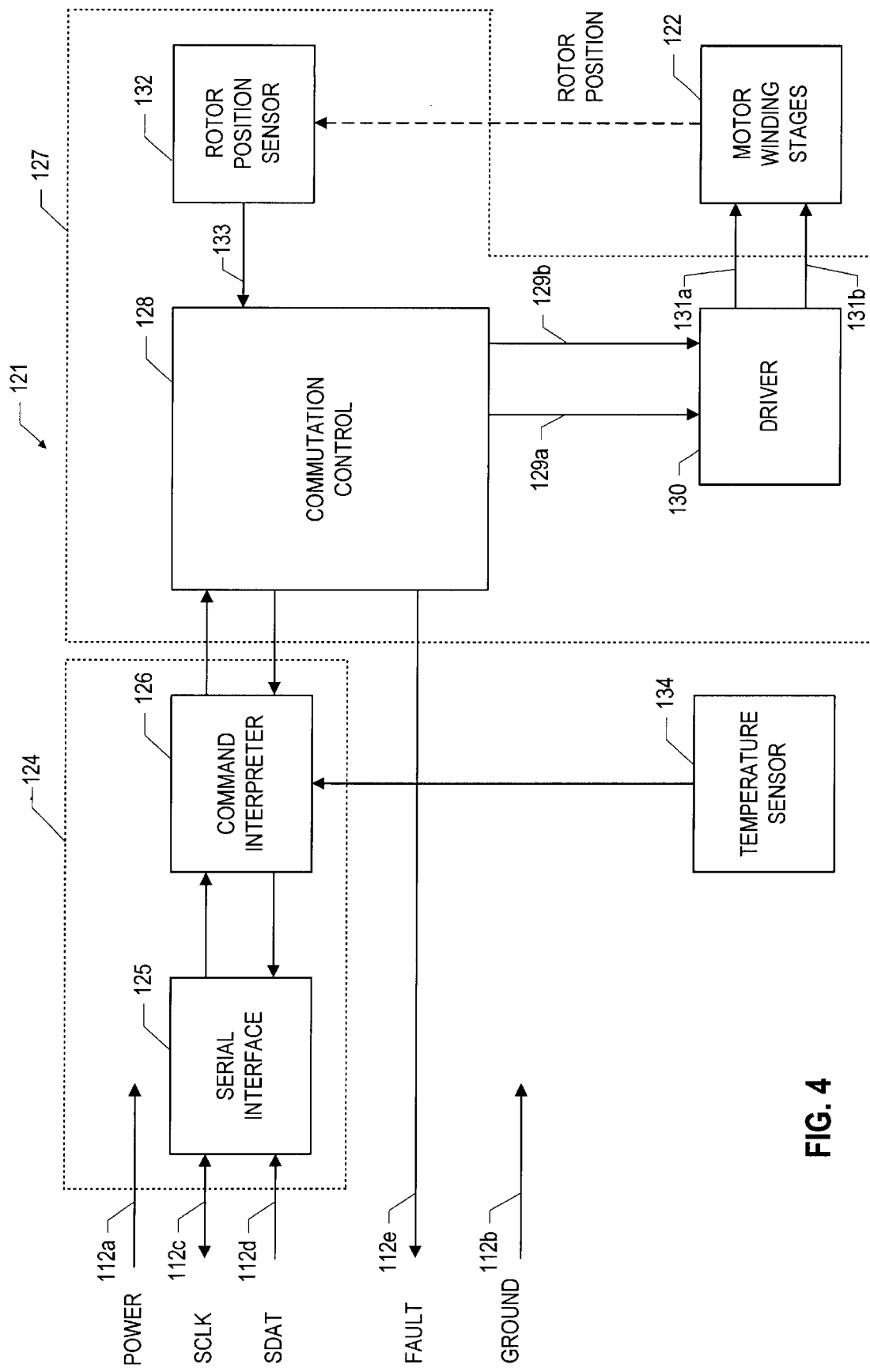
FIG. 4 is a block diagram illustrating major functional components of the fan module depicted in FIG. 3.

Referring now to FIG. 4, a functional block diagram is shown corresponding to the fan module 100 depicted in FIG. 3. A fan control circuit 121 includes a communication port 124 and a motor control circuit 127. Power for the fan control circuit 121 is provided on terminal 112a and the reference potential, ground, is provided on terminal 112b. The communications port 124, for this embodiment, provides for a two-wire serial interface. A serial clock is provided to the fan control circuit on terminal 112c and a bidirectional serial data signal is communicated to and from the fan control circuit 121 on terminal 112d. The serial clock and serial data signals are communicated directly to a serial interface 125 which communicates with a command interpreter 126, both of which are included within the communication port 124. An optional temperature sensor 134 may be included within the fan control circuit 121 to provide the capability of ascertaining a localized temperature within the fan module 100. Examples of various particularly useful commands include a Set-Desired-Fan-Speed command (indicating a desired speed setting which is chosen from a plurality of available speed settings), a Query-Actual-Fan-Speed command, a Fan-Off command, a Query-Actual-Temperature command, and others.

The motor control circuit 127 includes a commutation control 128 which generates pulse-width-modulated signals on its outputs 129a and 129b, which are buffered by a driver 130 and coupled to energize the BLDC motor winding stages 122 by way of outputs 131a and 131b of the driver 130. Proper commutation of the motor winding stages 122 results in rotor movement which is sensed by a rotor position sensor 132 and communicated via node 133 to the commutation control 128. Consequently the commutation control 128, the driver 130 and the rotor position sensor 132, along with the motor winding stages 122, form a closed loop motor control. A FAULT signal may optionally be generated by the commutation control 128 to directly provide at an optional terminal pin 112e an indication of a fault condition such as a stuck rotor or a rotor whose actual rotational speed differs significantly from that commanded.

Figure 5:
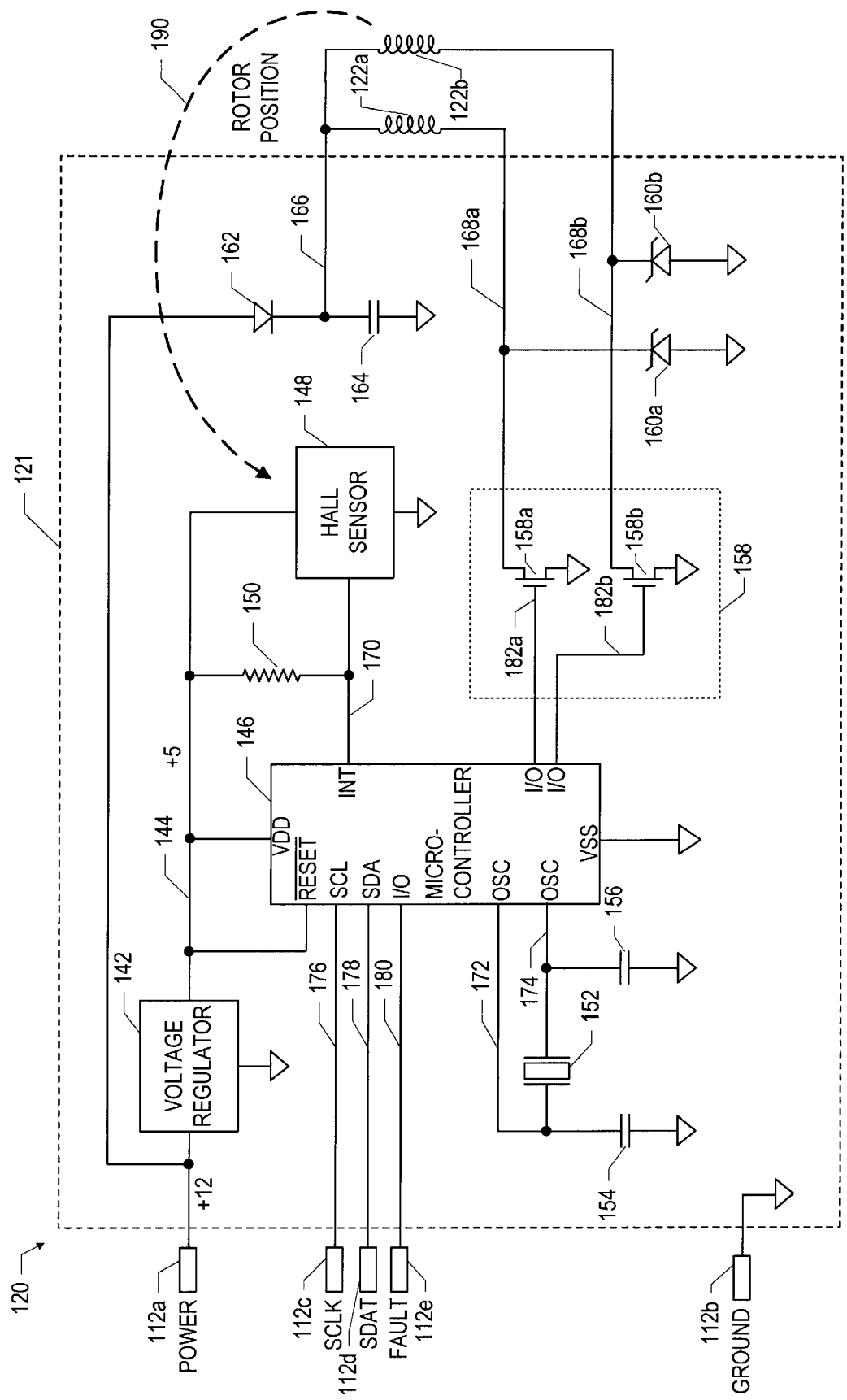
FIG. 5 is a schematic diagram illustrating one embodiment of fan control circuitry useful for the present invention.

One of many potential implementations of the functional block diagram shown in FIG. 4 is illustrated in FIG. 5. In this circuit, many of the functional blocks are implemented within a single integrated circuit programmable microcontroller 146. In particular the serial interface 125 and the command interpreter 126 of the communication port 124, and the commutation control 128 of the motor control circuit 127 are all implemented within the microcontroller 146. Suitable microcontrollers are well known in the art. One such device is an 8-bit microcontroller known as the PIC16C62B, available from Microchip Technology, Inc., located in Chandler, Ariz. This particular microcontroller includes 2048 words (each 14 bits wide) of one-time programmable program memory, 128 bytes of random access read/write memory (RAM), several programmable timers, and a serial I/O interface compatible with the I²C interface. The SMBus interface was based upon the earlier I²C interface, and the use of each is widely known in the art. The SMBus specification revision 1.1, dated Dec. 11, 1998, is incorporated herein by reference in its entirety. Other microcontrollers having fewer bytes of RAM and/or having factory programmed read-only memory instead of one-time programmable memory may easily be utilized instead, particularly to provide for lower production costs when manufactured with high unit volumes.

The rotor position sensor 132, previously shown in FIG. 4, may be implemented using a hall sensor 148. Suitable Hall-effect devices are well known in the art. One especially suitable device is the TLE4935G Hall-effect sensor, available from Infineon Technologies Corp, located in Cupertino, Calif. A pull-up resistor 150 is included on the open collector output 170 of the hall sensor 148, which output is communicated to an interrupt pin of the microcontroller 146. A transition on the output of the hall sensor 170 (in response to movement of the rotor) generates an interrupt request within the microcontroller 146, which is described in greater detail below.

A positive power supply voltage is conveyed to the fan control circuit 121 using terminal 112a. Nominally, this may be a 12-volt power supply, although voltages ranging from, for example, 7 volts to 30 volts may be easily accommodated. The voltage regulator 142 is provided which receives the input voltage and generates a regulated output of 5 volts (for this embodiment) on output node 144. Suitable voltage regulators are well known in the art. One especially suitable device is the LM78L05M voltage regulator, available from Fairchild Semiconductor Corp, located in Santa Clara, Calif. This 5-volt internal "power supply" voltage on node 144 is used to power both the integrated microcontroller 146 and the hall sensor 148.

A crystal 152 and two capacitors 154, 156 are provided to form a parallel resonant circuit between nodes 172, 174 for an internal oscillator within the microcontroller 146, which provides a timing reference for the internal clock generator contained within microcontroller 146. An 8 MHz crystal may be advantageously selected, along with 22 pF capacitors, to provide an 8 MHz clock rate. This clock rate provides adequate cycle times to implement the algorithms described herein. As before, the serial clock and serial data signals are communicated by way of terminals 112c and 112d, respectively, to nodes 176, 178 and communicated directly to the microcontroller 146, which implements the serial interface internally. An output of the microcontroller 146 or a configurable input/output pin is appropriately configured to generate the FAULT output which is communicated via node 180 to terminal 112e. The driver 130 is implemented with a pair of MOS driver transistors 158a, 158b. These driver transistors 158a, 158b receive on their respective gate terminals 182a, 182b respective pulse-width-modulated signals generated by the microcontroller 146. Each of these signals, when active, causes a low impedance path to ground through the respective driver transistor 158a, 158b, which provides a current path for energizing a respective winding stage 122a, 122b of the BLDC motor. The two driver transistors 158a, 158b are preferably implemented using an integrated pair of driver transistors, indicated by dashed line 158. Many suitable devices are available, including the Si4936DY Dual N-Channel 30-volt power MOSFET pair, available from Vishay Siliconix, located in Santa Clara, Calif. Alternatively, two individual discrete transistors (e.g., MOSFETs or bipolar) could be implemented. In other cases, a microcontroller may be utilized which can directly drive the winding stages without using an external buffer.

Zener diodes 160a and 160b are provided to swallow the inductive voltage kick otherwise generated by the winding stages 122a, 122b when the respective driver transistor 158a, 158b suddenly shuts off during normal commutation of the winding stages 122a, 122b. Zener diodes with 20-volt zoner voltages may be advantageously used to provide adequate over-voltage protection for the outputs of the power transistors (which, for this embodiment, are 30-volt MOSFETs). Diode 162 is provided to ensure that current does not flow back into the positive 12-volt power supply node (connected to terminal 112a) when the winding stages 122a, 122b are commutated. Capacitor 164 is a filtering capacitor to help stabilize the voltage on node 166 when the various winding stages 122a, 122b are energized and de-energized during normal commutation. The movement of the rotor is indicated by dashed line 190 and the rotor position is sensed by the hall sensor 148. A transition on the output node 170 of the hall sensor is generated every time the rotor rotates 90 degrees. This transition then generates an interrupt request within the microcontroller 146, which when serviced, commutates the winding stages by energizing the next winding stage to keep the rotor rotating.

Figure 6:
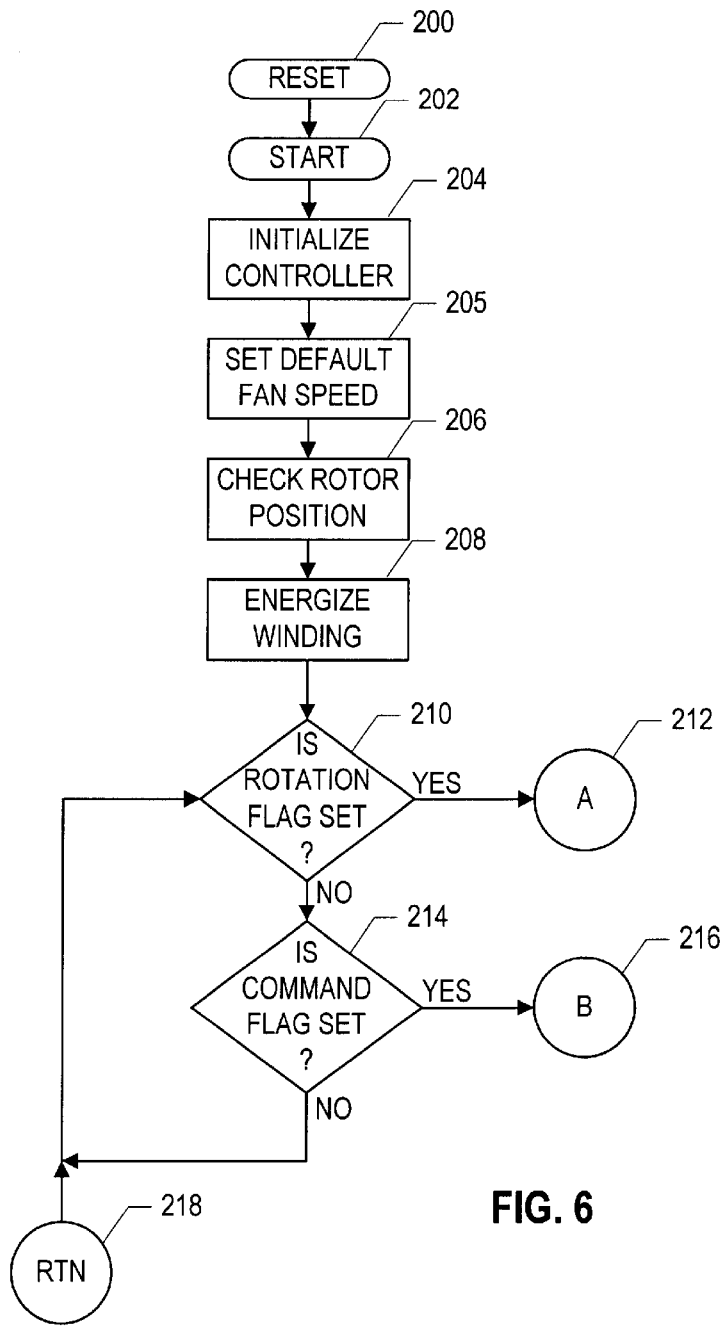
FIG. 6 is a flowchart diagram illustrating, for an exemplary embodiment, a portion of the software incorporated within a microcontroller depicted in FIG. 5.

Referring now to FIG. 6, a flowchart diagram is shown which illustrates the initialization and main control loop of exemplary firmware programmed into the microcontroller 146 shown in FIG. 5. This flowchart is but one of many possible flowcharts which could be implemented to carry out the functions required within the microcontroller 146. During power up, the microcontroller 146 is automatically reset (flowchart step 200). Control then proceeds to step 202, which is the start of the main control portion of this firmware. Control first passes to step 204 where the controller is initialized. Examples of such initialization include setting internal timer configuration and default/preload values, configuring timer prescalers and watchdog timers, configuring I/O ports to select one of several modes of operation and particular I/O characteristics, initializing programming variables, and similar operations depending upon the particular microcontroller chosen and other implementation decisions. Control then passes to step 205 which sets the default fan speed. This is provided so that, in the absence of any communication via the communication port, the fan module will power up to a default speed rather than awaiting a command merely to turn the fan on. After setting the default fan speed, control passes to step 206 which checks the rotor position. This is done by interrogating the output of hall sensor 148. In the circuit shown in FIG. 5, the interrupt (INT) pin on the microcontroller 146 to which the hall sensor 148 is connected operates as a traditional interrupt (generating the interrupt on a transition of the input signal), but the input signal can also be sampled using a level-sensitive input buffer. The appropriate winding stage is then energized in step 208 to initiate movement of the rotor and, optionally, a watchdog timer is set. A control loop is then entered in step 210 which checks for each of two specific flags being set. Each of these flags is set, for example, by an interrupt service routine as described below. At step 210 the ROTATION flag is checked; if it is set, control passes to flowchart A, labeled as 212. If not set, control passes to step 214 which interrogates the COMMAND flag. If set, control passes to flowchart B, labeled as 216. If not, control returns to step 210. Each of these flowcharts A and B execute and return to the main control loop at step 218, which returns control to step 210 to repeat the flag interrogations.

Figure 7:
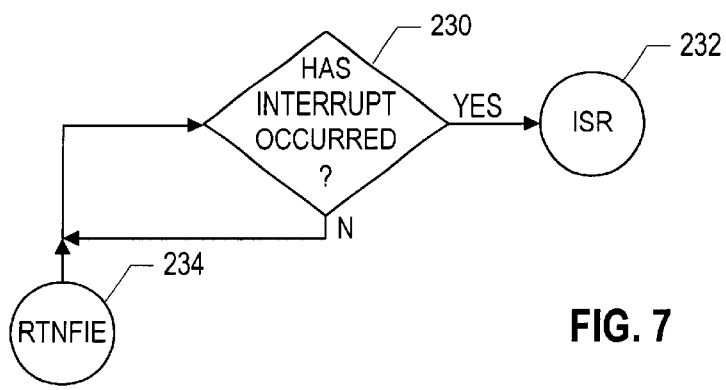
FIG. 7 is a flowchart diagram illustrating, for an exemplary embodiment, the processing of an interrupt by the microcontroller depicted in FIG. 5, and is a companion flowchart to that shown in FIG. 6.

Referring now to FIG. 7, the basic interrupt service processing is depicted in this flowchart at step 230. Whenever an interrupt occurs, indicated in this flowchart at step 230 as a test for such an interrupt occurring, control passes to an interrupt service routine ISR, labeled as 232, which ascertains the nature of the interrupt and processes the interrupt accordingly. Control then returns at step 234 from the interrupt service routine 232, and passes back to step 230 to await further interrupts. The flowchart depicted in FIG. 7 for most microcontrollers is not explicitly programmed (other than an interrupt service routine address or vector), but represents the typical functionality of microcontrollers that support interrupts and which may be configured to vector to a particular interrupt service routine whenever the interrupt occurs.

Figure 8:
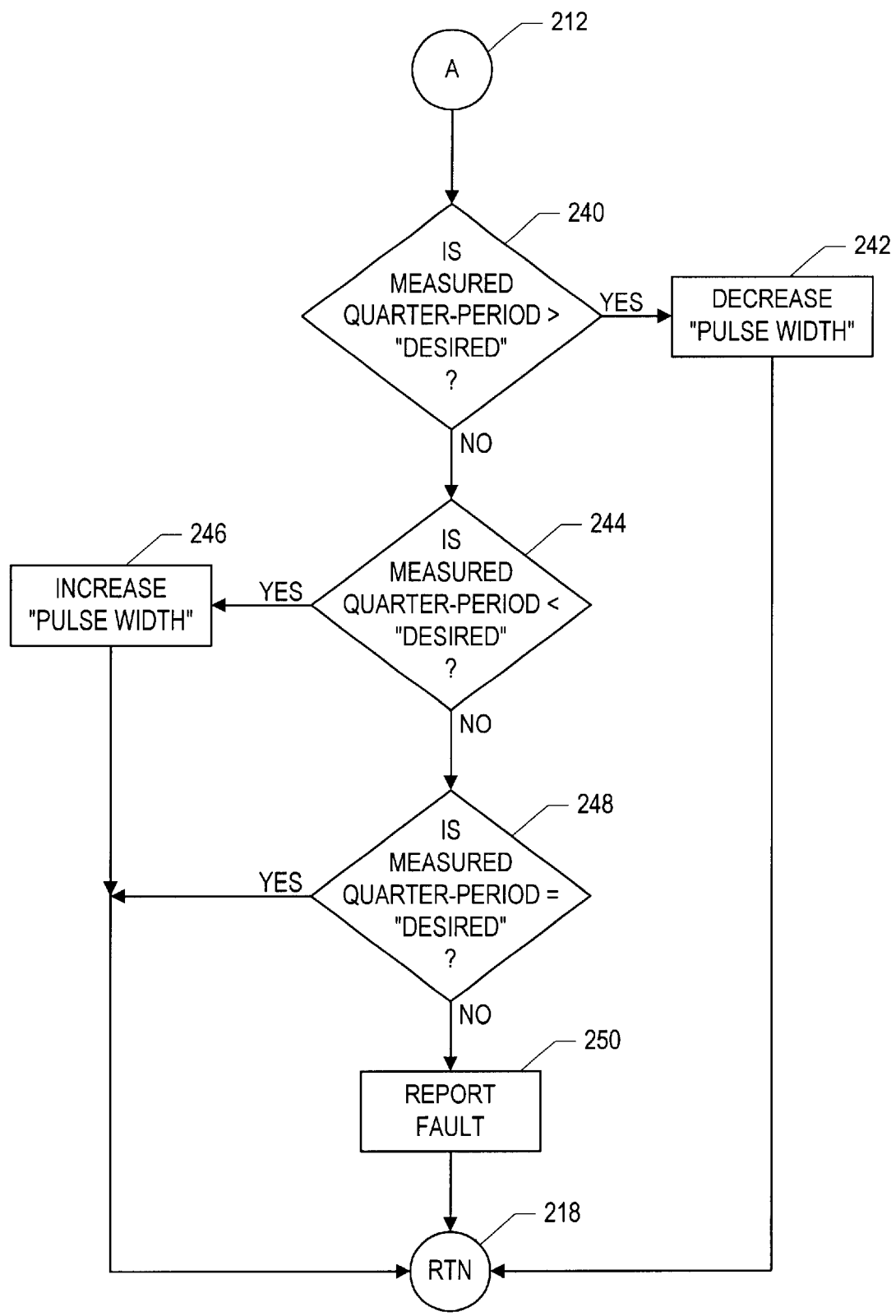
FIG. 8 is a flowchart diagram illustrating, for an exemplary embodiment, various steps performed to adjust the speed of the brushless DC motor.

Referring now to FIG. 8, a flowchart diagram is shown which is executed whenever the ROTATION flag is detected at earlier step 210 as being set. In the exemplary embodiment, the ROTATION flag is set by an interrupt service routine which responds to a rotation interrupt which is generated whenever the hall sensor 148 senses that the rotor has rotated 90 degrees (i.e., one-quarter of the rotation period), as described in greater detail below. After entering at step 212, control first passes to step 240 which compares the "measured quarter-period" with the "desired quarter-period" (which variable is set based upon a received fan speed command). If the measured quarter-period is greater than the desired, control passes to step 242 which decreases the value of a pulse width variable. This variable controls the duration of both pulse-width-modulated signals generated on the two outputs of the commutation control 128, which thus controls the volt-ampere (V-A) product of an energized winding stage. Control then returns at step 218 to the main control loop shown in FIG. 6. If at step 240 the test fails, control passes to step 244, and if the measured quarter-period is less than the desired quarter-period, control passes to step 246 which increases the pulse width of the pulse-width-modulated output signals. Again, control returns at step 218 to the main control loop. If the measured quarter-period is equal to the desired quarter-period, which is tested at step 248, then no adjustment is necessary to the timing of the pulse-width-modulated commutation output signals (i.e., neither the pulse width (duty cycle) nor the period), and control immediately returns at step 218. If all three tests fail, namely, the test performed at steps 240, 244 and 248, then control passes to step 250 which may be configured to report a fault, either by a dedicated fault pin, such as terminal 112e, or through the communication of a fault indication by way of the communication port to an external system connected thereto.

Figure 9:
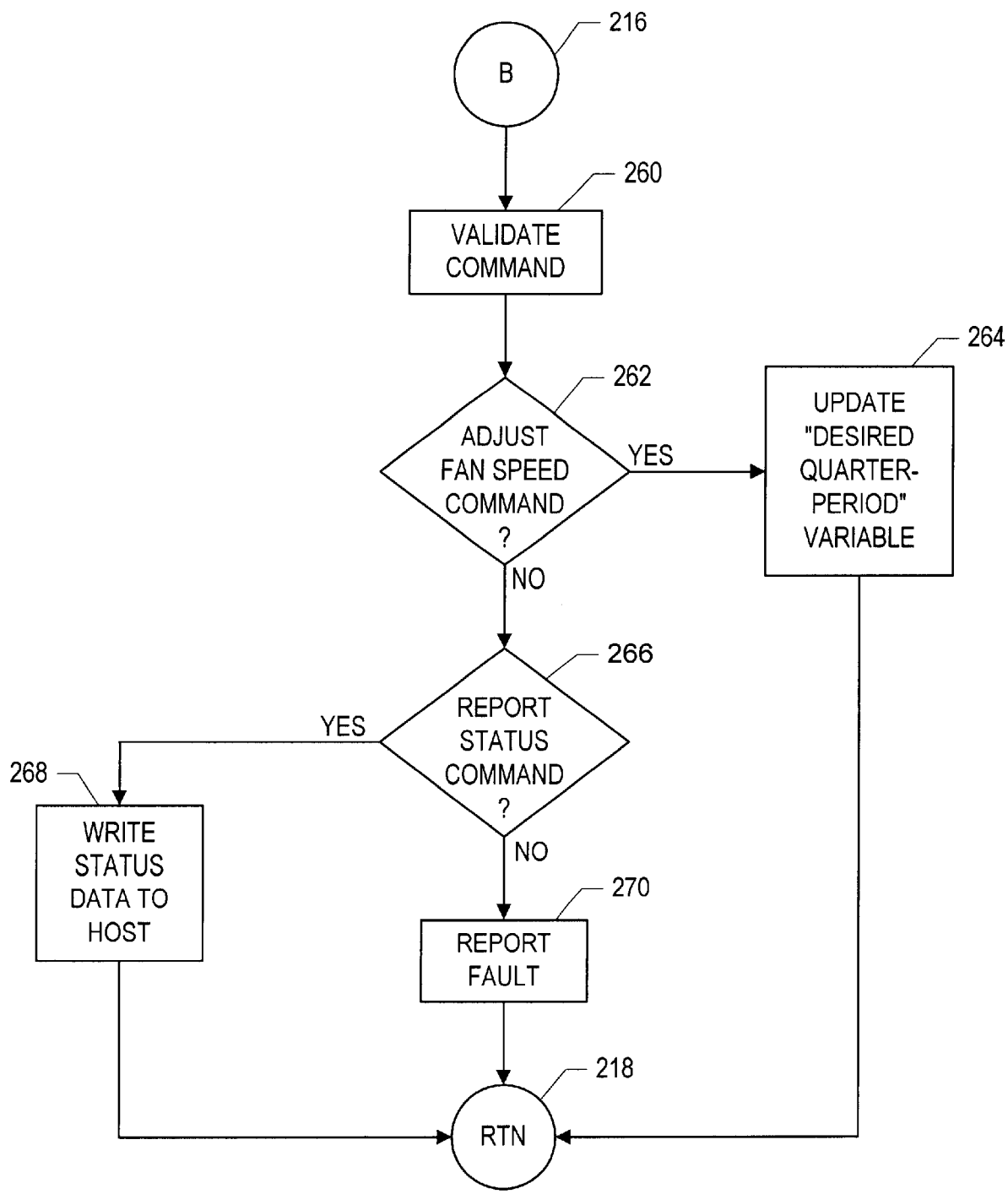
FIG. 9 is a flowchart diagram illustrating, for an exemplary embodiment, the steps performed to respond to a command received by the microcontroller depicted in FIG. 5.

Referring now to FIG. 9, a flowchart diagram is shown which is executed whenever the COMMAND flag is detected at step 210 as being set. Control enters at step B, labeled 216, and proceeds to step 260 to validate the command received. At step 262 the command is tested and, if determined to be a command to adjust the fan speed, control passes to step 264 which updates the "desired quarter-period" variable used to set the timing of the pulse-width-modulated commutation signals used to drive the motor winding stages within the fan. Otherwise the command is tested again at step 266 and, if determined to be a REPORT STATUS (i.e., QUERY) command, control passes to step 268 which writes the appropriate status data to the host by way of the communication port 124. If not a report status command, then control passes to step 270 to report a fault, again, either by way of a hard-wired pin and/or by a status word communicated to the host processor by way of the communication port.

Figure 10:
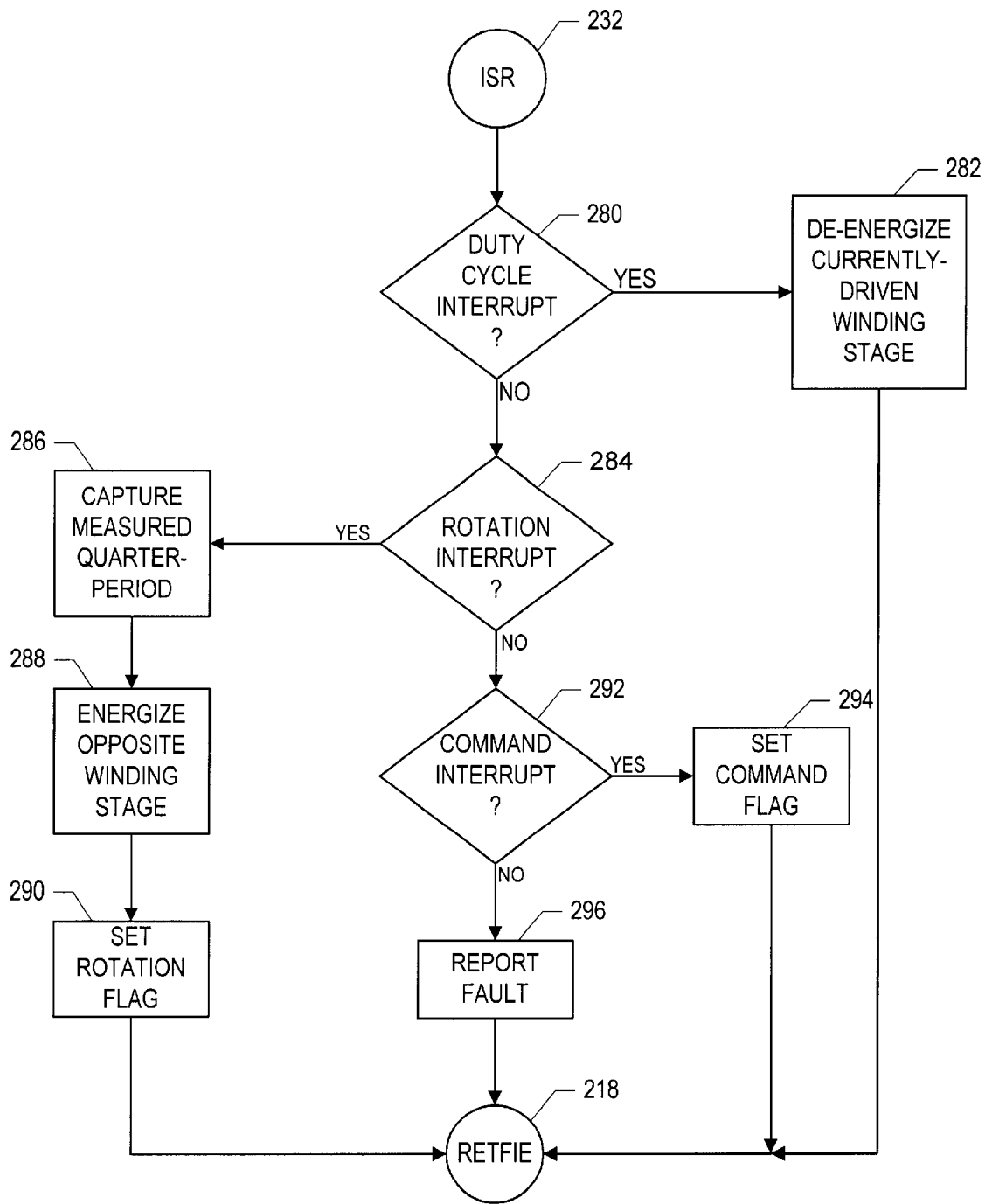
FIG. 10 is a flowchart diagram illustrating, for an exemplary embodiment, various steps performed to service an interrupt request within the microcontroller depicted in FIG. 5.

Referring now to FIG. 10, an exemplary embodiment of a suitable interrupt service routine 232 is depicted. Upon entering at step 232, the nature of the interrupt is determined by steps 280, 284 and 292. There are at least three types of interrupts explicitly processed by this routine: a duty cycle interrupt, a rotation interrupt, and a command interrupt. Additionally, other types, such as a watchdog timer interrupt, may also be processed, as described below.

Regarding a duty-cycle interrupt, each of the pulse-width-modulated commutation signals is controlled by an internal variable which sets the duty cycle (ie., pulse width) of the signal. When each PWM signal is driven active, an internal timer is loaded with a value corresponding to the present pulse width setting. When the timer "times out," an interrupt request is generated to indicate that the PWM signal should be driven inactive (thereby de-energizing the winding stage). This internal timer-generated interrupt request is herein referred to as a duty-cycle interrupt. Initially at step 280, if the interrupt is determined to be a duty-cycle interrupt, then control passes to step 282 which de-energizes the currently-driven winding stage, and control then returns at step 218 to await further interrupts. During startup of the fan, the duty cycle of the PWM signals is set for maximum speed to provide maximum torque to ensure that the fan begins rotation and spins up. For example, a value of 30 ms per winding stage may be set for the PWM signals. Such a long value ensures that, at startup, a winding stage will stay energized until the rotation of the rotor causes the next winding stage to be energized.

The second type of interrupt is a rotation interrupt. For every 90 degrees of rotor rotation, the hall sensor 148 generates a transition on its output node 170 which, being coupled to an external interrupt pin of the microcontroller 146, generates an interrupt request within the microcontroller 146. This type of interrupt indicates when the next winding stage should be driven to continue proper commutation of the motor. If the interrupt is determined, at step 284, to be a rotation interrupt, then control passes to step 286 which captures the measured quarter-period by storing the elapsed time since the previously-driven winding stage was earlier energized. This may be done in a variety of ways, including using programmable timers, software timing loops, or specialized hardware. At step 288, the currently-driven winding stage is de-energized if still found to be energized (as would typically occur at a fall-speed setting or during fan startup), and the opposite winding stage is energized. The ROTATION flag is set at step 290, a watchdog timer used for detecting, if timed-out, a stuck rotor is reset, and control returns at step 218 to await further interrupts.

Lastly, if the interrupt is a command interrupt (caused by, for example, the serial interface detecting a received command), control passes from step 292 to step 294 which sets the COMMAND flag and then control returns at step 218 to await further interrupts. If the interrupt is other than one of these three types, control passes to step 296, which reports a fault condition. An example of such a fault is a stuck rotor. A watchdog timer may be configured to time out well after (e.g., 500 ms) a winding stage is energized unless reset by a rotation interrupt. Consequently, if the rotor does not begin to rotate and start generating rotation interrupts, the fan may detect its stuck rotor and alert a host system to take necessary action.

The microcontroller 146 may be configured with a variety of registers. Some of these registers hold variables which may either be written by a host system or read by the host system. In the I$^2$C bus protocol, a pointer register selects which register is read from or written to. At power-up, the default value of the pointer register is set to reference the Command Speed (CS) register. The CS register is preferably a write-only register, and is used to dictate the desired speed of the fan. Another register is the Reported Speed (RS) register, a preferably read-only register used to report the actual speed of the fan. Under normal operating conditions, the two are identical. In the event that the fan motor cannot operate at the commanded speed, the RS register indicates the actual speed. In a system that commands and reads fan speed, a mismatch of the CS and RS registers may indicate a blocked fan or clogged filter, thus causing an alert condition in the system logic.

For an exemplary embodiment compatible with the I$^2$C interface, a write by the system host to the fan module 100 includes the address byte and the pointer byte to set the desired Pointer Register contents, as follows:

| Pointer Byte: | | | | | | | |
|---|---|---|---|---|---|---|---|
| P7 | P6 | P5 | P4 | P3 | P2 | P1 | P0 |
| 0 | 0 | 0 | 0 | 0 | 0 | 0 | Register Select |

| Register Select Truth Table: | |
|---|---|
| P0 | Register |
| 0 | Commanded Speed |
| 1 | Reported Speed |

If the pointer register contents are correct, then a read or a write is performed by the host system issuing the correct address byte followed by a data byte (for a write) or alternatively for a read, by the host system issuing the correct address byte followed by the retrieval of the data byte. Other pointer byte values may be used to access additional registers, such as a localized temperature within the fan module 100, and other possible features. By setting the pointer register once, sequential read or write commands to the same register may be executed over the I²C bus without re-transmitting an "address" of the register for each access, thus reducing bus traffic.

As described above, the speed of the fan may be controlled by the value written into the CS register. In an exemplary embodiment, there are 255 valid speed values that may be written to the CS register. The speed of the fan is linearly proportional to the value contained in the CS register as described in the table below:

| Commanded Speed Register Byte | Speed |
| --- | --- |
| 0x01 | 1000 RPM |
| 0x02 | 1011 RPM |
| . | . |
| . | . |
| . | . |
| 0xFE | 3988 RPM |
| 0xFF | 4000 RPM |

Currently, the value 0x00 may be used as a FAN OFF command. Reported speed values may be arranged to correspond to the commanded speed values one to one, making system comparison logic very simple.

As described above, the fan module 100 provides a communications port having a two-wire serial interface. Commands received are converted directly into a plurality of commutation signals which energize the winding stages of the BLDC motor to achieve variable speed control of the fan without varying the voltage across the winding stages when energized. The total parts count is very low, and facilitates incorporating the entire fan control circuit integrally with the fan module. A fan module in accordance with the present invention is well-suited for use in a microprocessor-based system, such as a personal computer, workstation, embedded system, etc.

Figure 11:
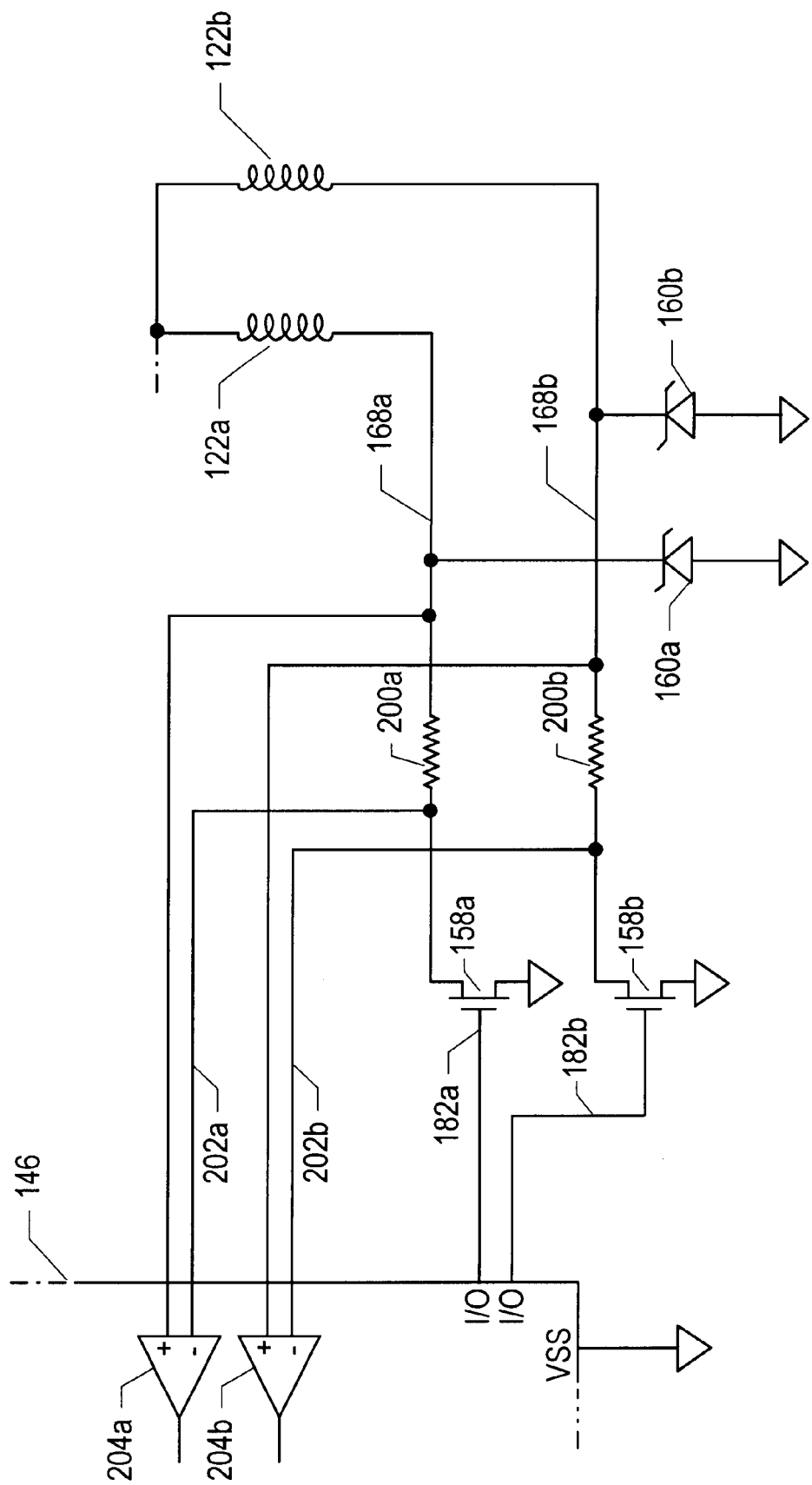
FIG. 11 is a schematic diagram for a portion of a motor control block which includes additional capability to detect current flow through each winding stage within the brushless DC motor.

Referring now to FIG. 11, low-valued series resistors may be included between the driver transistors 158a, 158b and the respective winding stages 122a, 122b so that the magnitude of the current flow through each of the winding stages may be ascertained. For example, resistors 200a, 200b are respectively included between winding stages 122a, 122b and driver transistors 158a, 158b. The voltage drop across each of these resistors 200a, 200b may be measured by a respective differential analog-to-digital (ADC) circuit 204a, 204b, which may be incorporated within certain available integrated circuit microcontrollers (as shown here within microcontroller 146) or may be implemented externally to a microcontroller. In particular, to sense the current flowing through winding stage 122a, one input of the differential ADC circuit 204a (shown here as the positive input) is connected to node 168a, and the other input (shown here as the negative input) is connected to node 202a. Likewise, the current flowing through winding stage 122b may be determined by connecting the positive input of differential ADC circuit 204b to node 168b, and the negative input to node 202b. By including a capability such as this, the magnitude of the current flow through the winding stages may be determined, and if excessive, or alternatively if non-existent, an appropriate status or fault indication may be communicated.

Figure 12:
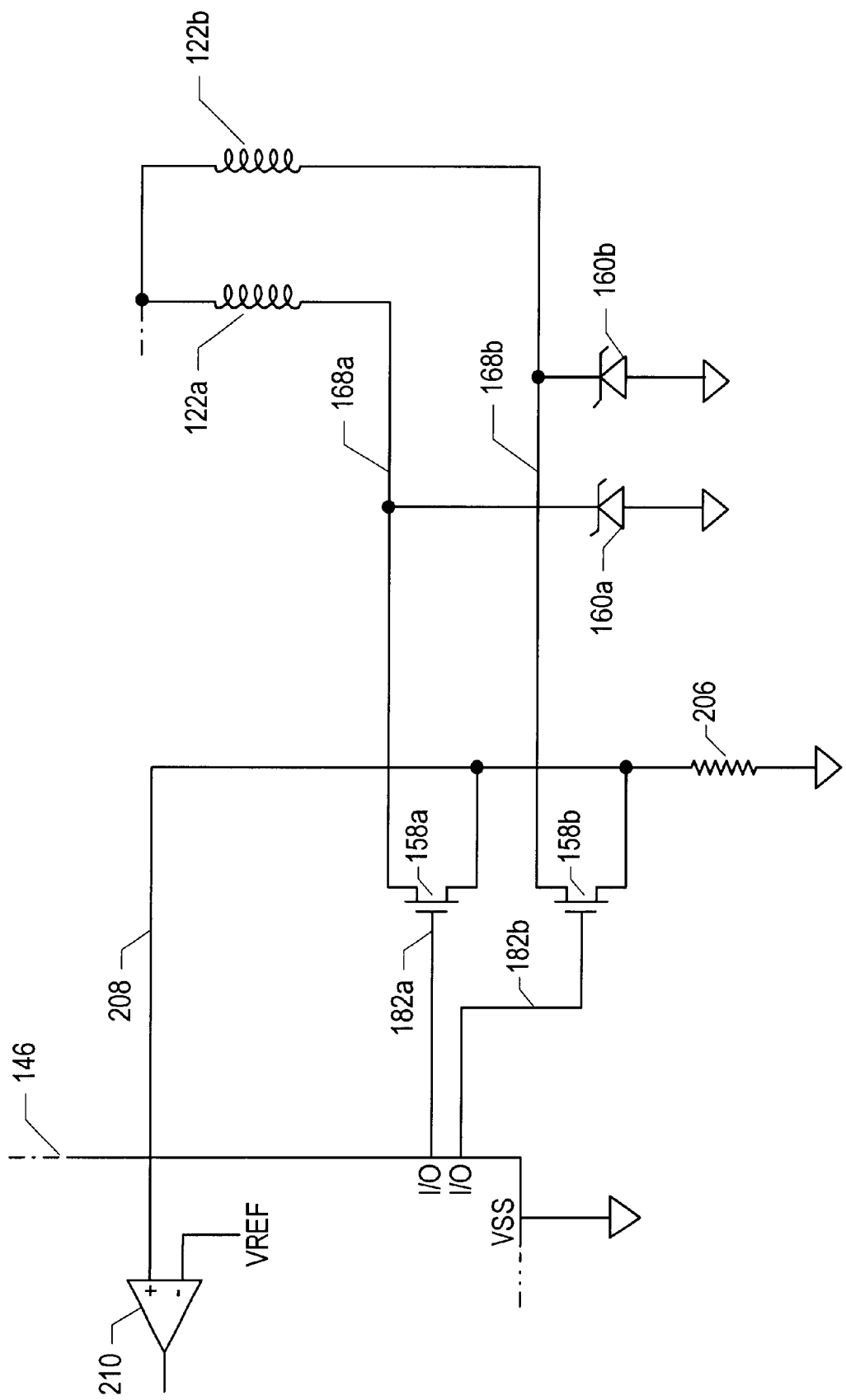
FIG. 12 is a schematic diagram for a portion of a motor control block which includes another circuit for detecting current flow through the winding stages within the brushless DC motor.

Referring now to FIG. 12, a single low-valued series resistor may be included between the driver transistors 158a, 158b and their respective source terminal connections to ground so that the magnitude of the current flow through either winding stage may be ascertained. For example, resistor 206 is included between node 208 and ground. The source terminal of each driver transistor 158a, 158b is connected to node 208 rather than directly to ground so that the current flowing through an energized winding stage also flows through resistor 206. The voltage drop across this resistor 206 (and inferentially, the current flow through the winding stages) may be measured by a single analog-to-digital (ADC) circuit 210, which preferably may be incorporated as shown here within the integrated circuit microcontroller 146 (using, for example, an internally generated reference voltage, VREF, as is found in several commercially available microcontrollers) or may be implemented externally to a microcontroller. By including a capability such as this, the magnitude of the current flow through the winding stages may be determined in a manner which requires fewer circuit resources than that shown in FIG. 11. As before, if the current is either excessive or non-existent, an appropriate status or fault indication may be generated and/or communicated to a host.

Figure 13:
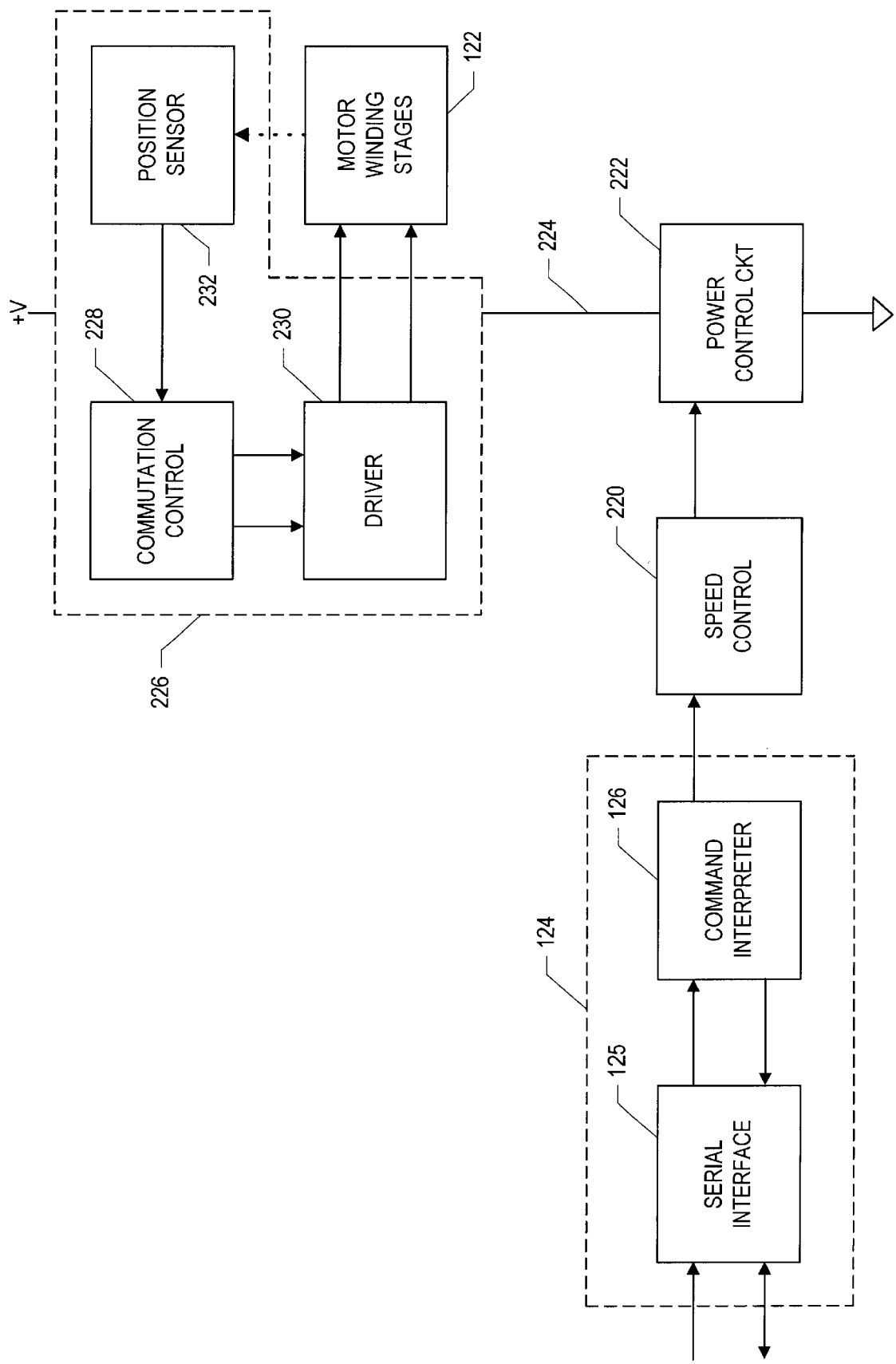
FIG. 13 is a functional block diagram illustrating major functional components of a fan module which includes an integral communications port and a power control circuit for a brushless DC motor.

Referring now to FIG. 13, a functional block diagram of another fan module is shown. A communication port 124 includes a serial interface 125 coupled to a command interpreter 126, as before. In this particular fan module, a motor control circuit 226 is more typical of the type utilized in a stand-alone two-terminal industry-standard brushless DC fan motor. It includes a commutation control circuit 228 for generating at least two commutation signals which are buffered by driver 230 to drive the motor winding stages 122. A position sensor 232 detects the position of the rotor, and provides an input to the commutation control circuit 228 for motor driven by the motor control circuit 226 may be controlled by controlling the power applied to the entire motor control circuit 226. This is done by power control circuit 222, which is controlled by speed control circuit 220. The power control circuit 222 may include a linear voltage regulator circuit which is used to vary the voltage impressed across the motor control circuit 226 as a function of the desired rotational speed of the rotor. Alternatively, the power control circuit may include a pulse-width-modulating circuit to chop the power impressed across motor control circuit 226. In either case, the fan module includes, as shown, a communication port integrated with the fan module for directly responding to fan control commands. Moreover, the voltage coupled to the fan module by a system into which the fan module is incorporated is a constant voltage. By incorporating the power control circuit 222 into the fan module, the user is relieved of the burden of providing additional external components for controlling a separate fan module, Moreover, system reliability is improved.

While the invention has been largely described with respect to the embodiments set forth above, the invention is not necessarily limited to these embodiments, which are given by way of example only. Variations and modifications of the embodiments disclosed herein may be made based on the description set forth herein, without departing from the scope and spirit of the invention as set forth in the following claims. For example, suitable implementations may be fashioned in hardware or software, or a combination thereof. Portions may be implemented using a programmable microcontroller, a general purpose microprocessor, dedicated hardware, a microcontroller core mapped into a custom integrated circuit, gate array, standard cell array, an ASIC, or any of several widely available circuit forms which can be chosen which meet the necessary performance requirements. Software timing loops may be used rather than or in combination with hardware interrupts. A serial interface may be provided in some commercially available microcontrollers, may be fashioned using hardware, or may even be implemented using largely software methods executing on relatively general purpose hardware. A variety of well-known serial interfaces may be chosen, including an SMBus or I²C interface, an RS-232 interface (or its military or ITU equivalent), a 3-wire SPI interface, a Universal Serial Bus (USB) interface, or others. A power supply voltage other than +12 volts may be chosen according to system availability and designer choice. Rotation sensors other than hall sensors may be chosen such as, for example, optical sensors. Accordingly, other embodiments, variations, and improvements not described herein are not necessarily excluded from the scope of the invention, which is defined by the following appended claims.

What is claimed is:

1. A fan module comprising:
    a fan housing;
    an electronically commutated motor mounted to the fan housing, said motor including a stationary armature having a core and at least two independently energizable winding stages arranged to establish a predetermined number of magnetic poles, and further including a permanent magnet rotor adapted to rotate in response to the magnetic poles established by the winding stages;
    a plurality of fan blades coupled to the rotor; and
    a fan control circuit including
        a communication port for operably receiving digital commands, at least one of which for controlling the rotational speed of the rotor; and
        a motor control circuit coupled to the communication port and having at least two outputs, each respectively coupled to a respective winding stage, said motor control circuit for generating on each respective output a respective pulse-width-modulated (PWM) signal to energize the respective winding stage coupled thereto at respective times for respective durations of time to rotate the rotor with a rotational speed responsive to a received digital command;
        wherein the fan control circuit is arranged to respond to any of a plurality of digital commands, each corresponding to a respective rotational speed of the rotor, by adjusting the timing and duration of the respective pulse-width-modulated signals to adjust the rotational speed in accordance with a digital command received; and
        wherein the fan control circuit is arranged to respond to a "fan off" digital command by preventing the respective pulse-width-modulated signals from occurring.

2. A fan module as recited in claim 1 wherein the fan control circuit is arranged to impress across each winding stage, when energized, a voltage which is substantially independent of the rotational speed of the rotor.

3. A fan module as recited in claim 1 wherein the fan control circuit is arranged to impress across each winding stage, when energized, a voltage which varies with the rotational speed of the rotor.

4. A fan module as recited in claim 1 wherein the fan control circuit further comprises:
    a power control circuit coupled between the motor control circuit and the communication port, for controlling power applied to the motor control circuit, and to thereby control the rotational speed, in accordance with a received digital command.

5. A fan module as recited in claim 4 wherein the power control circuit comprises a linear voltage regulator circuit for varying a voltage impressed across the motor control circuit.

6. A fan module as recited in claim 4 wherein the power control circuit comprises a pulse-width-modulating circuit for chopping power impressed across the motor control circuit.

7. A fan module as recited in claim 1 wherein:
    the motor control circuit includes a rotor position sensor for generating a signal indicative of rotor position relative to the magnetic poles established by the winding stages; and
    the fan control circuit is arranged to determine actual fan speed by observation of changes in the rotor position sensor signal as a function of time.

8. A fan module as recited in claim 1 wherein the fan control circuit includes a provision for responding to a fan speed query command received by way of the communication port by providing a data word to indicate actual fan speed.

9. A fan module as recited in claim 1 wherein the communication port comprises a serial interface.

10. A fan module as recited in claim 9 wherein the serial interface comprises an I²C bus compatible interface.

11. A fan module as recited in claim 9 further comprising:
    a first power supply terminal for operably receiving a source of voltage which is substantially independent of fan rotor speed;
    a second power supply terminal for operably receiving a reference voltage;
    a first signal terminal for operably receiving a clock signal for the serial interface; and
    a second signal terminal for operably receiving a bi-directional data signal for the serial interface.

12. A fan module as recited in claim 9 wherein the serial interface comprises an RS-232 interface.

13. A fan module comprising:
    a fan housing;
    an electronically commutated motor mounted to the fan housing, said motor including a stationary armature having a core and at least two independently energizable winding stages arranged to establish a predetermined number of magnetic poles, and further including a permanent magnet rotor adapted to rotate in response to the magnetic poles established by the winding stages;
    a plurality of fan blades coupled to the rotor; and
    a fan control circuit including
        a communication port for operably receiving digital commands, at least one of which for controlling the rotational speed of the rotor; and
        a motor control circuit coupled to the communication port and having at least two outputs, each respectively coupled to a respective winding stage, said motor control circuit for generating on each respective output a respective pulse-width-modulated (PWM) signal to energize the respective winding stage coupled thereto at respective times for respective durations of time to rotate the rotor with a rotational speed responsive to a received digital command;
        wherein the communication port comprises an I²C bus compatible serial interface;
    a first power supply terminal for operably receiving a source of voltage which is substantially independent of fan rotor speed;

a second power supply terminal for operably receiving a reference voltage;

a first signal terminal for operably receiving a clock signal for the serial interface; and a second signal terminal for operably receiving a bi-directional data signal for the serial interface.

14. A fan module as recited in claim 13 further comprising:

a third signal terminal for operably conveying a fault condition signal.

15. A fan module as recited in claim 13 wherein the fan control circuit is arranged to impress across each winding stage, when energized, a voltage which is substantially independent of the rotational speed of the rotor.

16. A fan module as recited in claim 13 wherein the fan control circuit is arranged to impress across each winding stage, when energized, a voltage which varies with the rotational speed of the rotor.

17. A fan module as recited in claim 13 wherein the fan control circuit further comprises:

a power control circuit coupled between the motor control circuit and the communication port, for controlling power applied to the motor control circuit, and to thereby control the rotational speed, in accordance with a received digital command.

18. A fan module as recited in claim 17 wherein the power control circuit comprises a linear voltage regulator circuit for varying a voltage impressed across the motor control circuit.

19. A fan module as recited in claim 17 wherein the power control circuit comprises a pulse-width-modulating circuit for chopping power impressed across the motor control circuit.

20. A fan module as recited in claim 13 wherein:

the motor control circuit includes a rotor position sensor for generating a signal indicative of rotor position relative to the magnetic poles established by the winding stages; and the fan control circuit is arranged to determine actual fan speed by observation of changes in the rotor position sensor signal as a function of time.

21. A fan module as recited in claim 13 wherein the fan control circuit includes a provision for responding to a fan speed query command received by way of the communication port by providing a data word to indicate actual fan speed.

22. A fan module as recited in claim 13 wherein the fan control circuit is arranged to respond to any of a plurality of digital commands, each corresponding to a respective rotational speed of the rotor, by adjusting the respective pulse-width-modulated signals to adjust the rotational speed in accordance with a digital command received.

23. A fan module as recited in claim 13 wherein the fan control circuit is arranged to respond to a "fan off" digital command by preventing the respective pulse-width-modulated signals from occurring.

24. A fan module comprising:

a fan housing;

an electronically commutated motor mounted within the fan housing, said motor including a stationary armature having a core and at least two independently energizable winding stages arranged to establish a predetermined number of magnetic poles, and having a permanent magnet rotor adapted to rotate in response to the magnetic poles established by the winding stages;

a plurality of fan blades coupled to the rotor; and a fan control circuit including a communications port having a two-wire bi-directional serial interface, for controlling at least the rotational speed of the rotor in accordance with a digital command operably received by way of the serial interface;

wherein the fan control circuit includes a provision for responding to a fan speed query command received by way of the serial interface by providing a serial data word to indicate actual fan speed.

25. A fan module as recited in claim 24 wherein the fan control circuit includes:

a motor control circuit coupled to operably receive a substantially constant voltage between a first power terminal and a second power terminal, said motor control circuit having at least two outputs, each respectively coupled to a respective winding stage, for generating on each respective output a respective pulse-width-modulated (PWM) signal to energize the respective winding stage coupled thereto at respective times for respective durations of time to both commutate the winding stages in a preselected sequence to rotate the rotor and with a rotational speed that is responsive to the digital command.

26. A fan module as recited in claim 24 wherein the fan control circuit further comprises:

a motor control circuit coupled to the communication port and having at least two outputs, each respectively coupled to a respective winding stage, said motor control circuit for generating on each respective output a respective winding signal to energize the respective winding stage coupled thereto;

a power control circuit coupled between the motor control circuit and the communication port, for controlling power applied to the motor control circuit and thereby control the respective winding signals to achieve a rotational speed in accordance with a received digital command.

27. A fan module as recited in claim 26 wherein the power control circuit comprises a linear voltage regulator circuit for varying a voltage impressed across the motor control circuit.

28. A fan module as recited in claim 26 wherein the power control circuit comprises a pulse-width-modulating circuit for chopping power impressed across the motor control circuit.

29. A fan module as recited in claim 24 wherein the fan control circuit includes:

a temperature sensor arranged to be responsive to a localized temperature within the fan module; and a provision for responding to a temperature query command received by way of the serial interface by providing a serial data word to indicate the temperature as sensed by the temperature sensor.

30. A fan module as recited in claim 24 wherein the serial interface comprises an $I^2C$ compatible interface.

31. A fan module as recited in claim 24 further comprising:

a first power supply terminal for operably receiving a source of voltage which is substantially independent of fan rotor speed;

a second power supply terminal for operably receiving a reference voltage;

a first signal terminal for operably receiving a clock signal for the serial interface; and a second signal terminal for operably receiving a bi-directional data signal for the serial interface.

32. A fan module as recited in claim 24 wherein the fan control circuit is arranged to respond to any of a plurality of digital commands, each corresponding to a respective rotational speed of the rotor, by adjusting the respective pulse-width-modulated signals to adjust the rotational speed in accordance with a digital command received.

33. A fan module as recited in claim 24 wherein the fan control circuit is arranged to respond to a "fan off" digital command by preventing the respective pulse-width-modulated signals from occurring.

34. A method of controlling an electronically commutated motor that includes a stationary armature having a core and at least two independently energizable winding stages arranged to establish a predetermined number of magnetic poles, and having a permanent magnet rotor adapted to rotate in response to the magnetic poles established by the winding stages, said method comprising the steps of:

receiving a digital command;

generating at least two pulse-width-modulated (PWM) signals, each respectively coupled to energize a respective winding stage at respective times for respective durations of time to commutate the winding stages in a preselected sequence to rotate the rotor with a rotational speed responsive to the received digital command;

generating a signal indicative of rotor position relative to the magnetic poles established by the winding stages;

receiving one of a plurality of digital commands, each corresponding to a respective rotational speed of the rotor; and adjusting the timing and duration of the respective pulse-width-modulated signals to adjust the rotational speed in accordance with the digital command received.

35. A method as recited in claim 34 further comprising:

impressing across each winding stage, when energized, a voltage which is substantially independent of the rotational speed of the rotor.

36. A method as recited in claim 34 further comprising:

impressing across each winding stage, when energized, a voltage which varies with the rotational speed of the rotor.

37. A method as recited in claim 34 further comprising:

responding to a fan speed query command received by way of the communication port by providing a data word to indicate actual fan speed.

38. A method as recited in claim 34 further comprising:

responding to a "fan off" digital command by preventing the respective pulse-width-modulated signals from occurring.

39. A method as recited in claim 34 wherein the digital command is received by way of a serial interface.

40. A method as recited in claim 39 wherein the serial interface comprises an I$^2$C compatible interface.

41. A method as recited in claim 34 further comprising:

generating a rotor position signal from which the current rotational speed of the rotor may be inferred; and adjusting the at least two pulse-width-modulated signals in accordance with both the digital control signal and the current rotational speed inferred from the rotor position signal, to urge the rotational speed closer to a desired rotational speed.

* * * * *